United States Patent [19]

Haskell et al.

[11] Patent Number: 5,198,298

[45] Date of Patent: Mar. 30, 1993

[54] ETCH STOP LAYER USING POLYMERS

[75] Inventors: Jacob D. Haskell, Palo Alto; Subhash Gupta, San Jose, both of Calif.

[73] Assignee: Advanced Micro Devices, Inc., Sunnyvale, Calif.

[21] Appl. No.: 426,147

[22] Filed: Oct. 24, 1989

[51] Int. Cl.$^5$ ............................................. B32B 33/00
[52] U.S. Cl. ................................... 428/336; 428/428; 428/429; 428/446; 428/447; 428/701
[58] Field of Search ............... 428/446, 447, 448, 428, 428/429, 336, 701; 437/238, 978, 235

[56] References Cited

U.S. PATENT DOCUMENTS

| | | | |
|---|---|---|---|
| 3,607,480 | 9/1971 | Harrap | 437/238 |
| 3,625,749 | 12/1971 | Yoshioka et al. | 437/243 |
| 3,649,884 | 3/1972 | Haneta | 437/42 |
| 3,652,331 | 3/1972 | Yamazaki | 428/446 |
| 3,658,584 | 4/1972 | Schmidt | 437/238 |
| 3,660,156 | 5/1992 | Schmidt | 437/238 |
| 3,847,919 | 4/1975 | Lehman | 437/241 |
| 3,877,980 | 4/1975 | Martin et al. | 430/296 |
| 3,973,057 | 8/1976 | Channin et al. | 428/429 |
| 3,988,823 | 11/1976 | Hu | 437/238 |
| 4,004,044 | 1/1977 | Franco et al. | 156/653 |
| 4,040,874 | 8/1977 | Yerman | 428/447 |
| 4,123,564 | 10/1978 | Ajima et al. | 437/238 |
| 4,196,440 | 4/1980 | Anantha et al. | 437/51 |
| 4,273,420 | 6/1981 | Watanabe et al. | 428/429 |
| 4,367,119 | 1/1983 | Logan et al. | 156/643 |
| 4,368,573 | 1/1983 | DeBrebisson et al. | 437/978 |
| 4,373,255 | 2/1983 | Goronkin | 437/238 |
| 4,374,696 | 2/1983 | Schmidt et al. | 428/429 |
| 4,516,316 | 5/1985 | Haskell | 357/91 |
| 4,647,472 | 3/1987 | Hiraki et al. | 437/238 |
| 4,683,024 | 7/1987 | Miller et al. | 156/643 |
| 4,737,379 | 4/1988 | Hudgens et al. | 437/234 |
| 4,758,476 | 7/1988 | Sekine et al. | 428/429 |
| 4,765,865 | 8/1988 | Gealer et al. | 428/450 |
| 4,818,714 | 4/1989 | Haskell | 437/44 |
| 4,827,641 | 10/1989 | Dorg | 437/238 |

Primary Examiner—Ellis P. Robinson
Assistant Examiner—A. A. Turner
Attorney, Agent, or Firm—Benman & Collins

[57] ABSTRACT

An etch stop player (22) for permitting distinguishing between two similar layers (20, 24), such as two oxide layers, during etching is provided. The etch stop layer comprises a silicon-oxyhalide polymer, preferably a silicon-oxyfluoride polymer. Use of the polymer as an etch stop layer permits closer placement of metal conductor surfaces (12, 12') and contacts (14').

3 Claims, 2 Drawing Sheets

ETCH STOP LAYER USING POLYMERS

BACKGROUND OF THE INVENTION

1. Field of the Invention

The present invention relates to the fabrication of integrated circuits, and, more particularly, to an etch stop layer in MOS (metal oxide semiconductor) device processing.

2. Description of the Related Art

The formation of via contacts between two conductors in MOS processing by etching requires an increased amount of area than the contact itself. This is due to nature of the etching process, and becomes ever more critical as scaling of ICs enter the sub-micrometer domain. Accordingly, process engineers continue to develop new processes in an attempt to reduce the amount of area required for making contacts.

One problem for which a solution has long been sought is the tendency of gouging an oxide lying under a metal as the contact is misaligned with the underlying metal layer.

Problems in the past when making a contact to a first level interconnect have necessitated the formation of a "dogbone"-shaped contact where the contact is to be made to the interconnect, so that a misaligned contact would not short to the underlying structures. This is especially a problem where the depths of the oxide to be etched are variable. For example, in a field effect transistor (FET), a contact to a first level interconnect over field oxide is different than a contact to a first level interconnect over a source or drain region.

SUMMARY OF THE INVENTION

Accordingly, it is an object of the present invention to provide a process for forming contacts in ICs which consumes as little area as possible, and allows the pitch (line and space) of the contacted layer to be as small as that of an uncontacted layer.

In accordance with the invention, an etch stop layer is formed between two similar dielectric layers. The etch stop layer comprises a silicon-oxyhalide polymer, and allows one to distinguish between two similar materials, due to the property of its much lower etch rate.

Other objects, features and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

DETAILED DESCRIPTION OF THE INVENTION

Figure 1A:
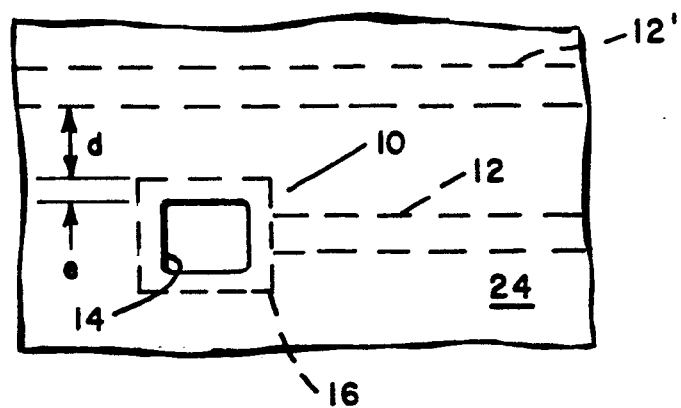
FIGS. 1a and 1b are top plan views, illustrating one prior art approach to solving misalignment problems, but which requires additional area of the device for implementation, "e" being the margin required to ensure the contact is always on a pad of contacted interconnect.

FIG. 1a depicts the prior art approach of forming a "landing pad" structure 10, which, however, uses up extra area and prohibits using tight spacing "d" between adjacent interconnects 12 and 12'. The landing pad structure 10 comprises a via contact 14, which, to ensure electrical contact with the underlying interconnect 12, regardless of alignment, is overlapped with an overlap region of width "e".

Figure 1B:
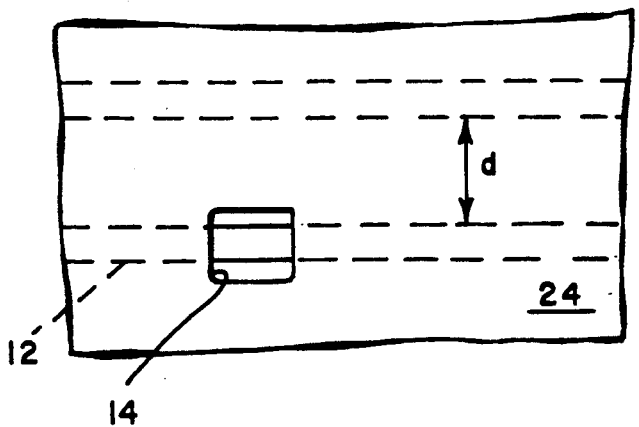

The non-lapped approach compromises the metal pitch due to the spacing "d" needed to the adjacent metal interconnect 12' and the spacing "e" to accommodate for misalignment. Thus, it would be beneficial to etch a contact in such a manner that a contacted and uncontacted metal line are spaced the same distance "d" apart. FIG. 1a depicts the present art of a landing pad for the contact, while FIG. 1b shows the optimum layout for a minimum pitch interconnect.

Figure 1C:
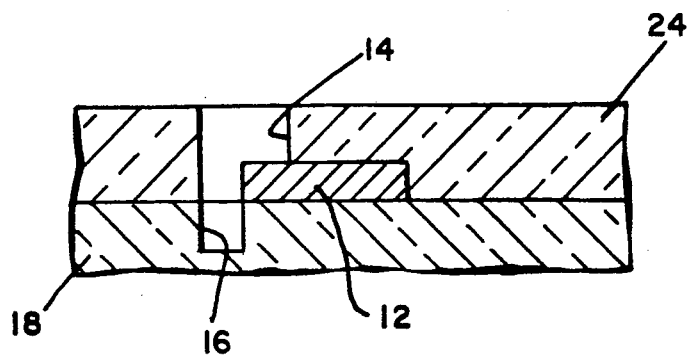
FIG. 1c is a cross-sectional view, depicting gouging of an underlying layer due to misalignment of etching a via contact.

The landing pad has the additional advantage of providing an etch-stop layer for the via 14 etch. This prevents gouging 16 of an underlying oxide or semiconductor layer 18 if a pad were not available, as seen in FIG. 1c. If a method to prevent such gouging can be obtained without the constraint of the landing pad area and pitch penalty, then the density of a contacted and uncontacted conductor can be made the same, giving both density and layout simplification advantages. This is achieved by the employment of an etch-stop layer, in accordance with the invention.

Reference is now made in detail to a specific embodiment of the present invention, which illustrates the best mode presently contemplated by the inventors for practicing the invention. Alternative embodiments are also briefly described as applicable.

Figure 2A:
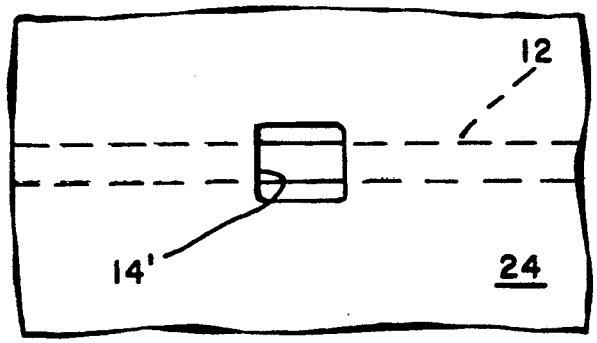
FIGS. 2a and 2b are top plan views, somewhat larger than FIGS. 1a and 1b, of a contact formed in accordance with the invention, depicting alignment (FIG. 2a) and misalignment (FIG. 2b)
Figure 2B:
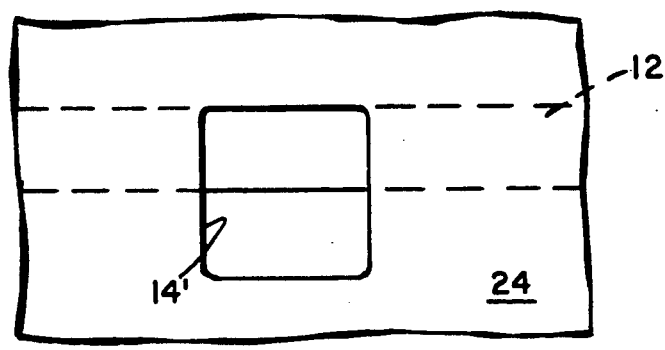

Lapped contacts are depicted in FIGS. 2a (aligned) and 2b (mis-aligned). In this configuration, the via 14' electrically contacts the metal layer 12 across at least part of the width.

It will be appreciated that the resulting metal area to form the contact is less than the prior art "dogbone", or "framed" contact depicted in FIG. 1.

For lapped contacts between metal layers, for example, the amount of over-etch is critical in the process. This prevents gouging (FIG. 1c) with the resultant propensity to electrically short and exhibit poor topology.

The process of the invention comprises the following steps:

(a) Deposit and pattern (etch) metal layer 12 on substrate 18. Metal layer 12 can be any conductor, including silicided polysilicon. The thickness of metal layer 12 is that conventionally employed in the art and typically ranges from about 0.4 to 0.8 μm.

(b) Deposit TEOS (tetra-ethyl ortho silicate), such as by plasma deposition, or other inter-layer dielectric 20.

(c) Planarize oxide 20 back to metal layer 12. The details of the planarization process are conventional and well-known and do not form a part of this invention.

(d) Expose oxide 20 to $SiF_4$ chemistry (in an etcher) to create a fluorine-rich polymer layer 22 on the palarized-back oxide 20. The polymer 22 is formed to any desired thickness, typically ranging from about 500 to 800 Å.

(e) Deposit second layer 24 of oxide on polymer layer 22. The thickness of this second layer 24 is that conventionally employed in the art; this thickness typically ranges from about 0.5 to 0.8 μm.

Figure 3:
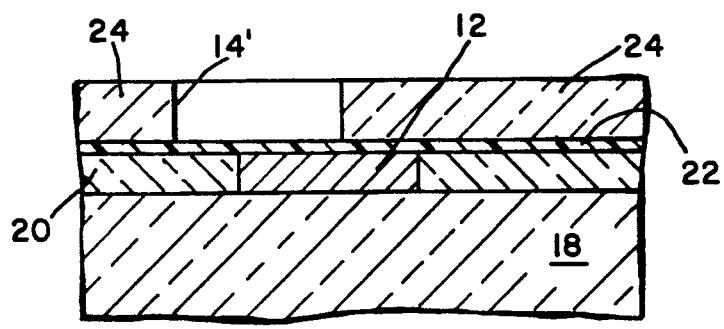
FIG. 3–5 are cross-sectional views, somewhat larger than FIG. 1c, depicting the process of forming a contact employing the etch stop layer of the invention.

(f) Form the contact etch mask 14' and etch the second dielectric layer 24. FIG. 3 depicts the structure of the wafer at this point. Due to the much slower etch rate of the polymer, the etch will stop on the polymer-rich layer 22. As an example, the etch rate of the oxide in typical $CHF_3/O_2$ chemistry in a batch reactor is about 420 to 440 Å/min, while the polymer etches at a rate of about 100 to 150 Å/min under the same conditions.

Figure 4:
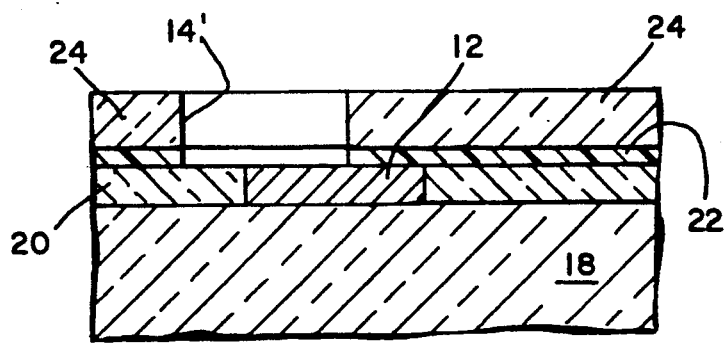

(g) Sputter-etch polymer layer 22 off metal surface 12. This exposes portions of the metal layer 12 to which electrical contact is to be made, and is depicted in FIG. 4.

Figure 5:
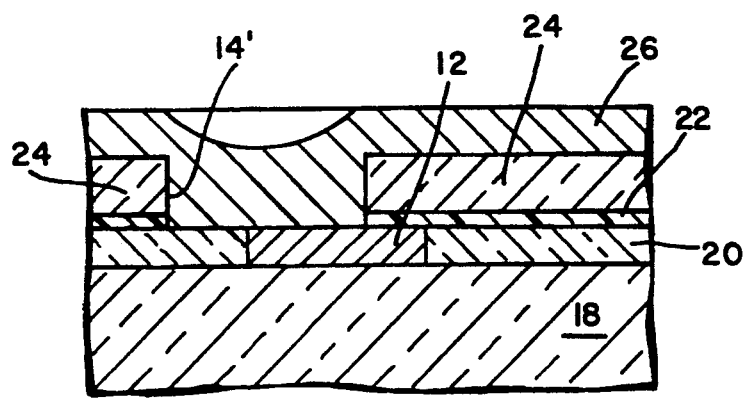

(h) Deposit metal layer 26. The completed structure is depicted in FIG. 5.

In general, the process of the invention is used to (i) create a surface that is rich in polymer over another layer such as oxide, (ii) deposit a second dielectric layer over this polymer layer, (iii) etch a pattern using conventional resist patterning and etch in this second dielectric, and (iv) stop the etch in the polymer layer, due to the much reduced etch rate of this (buried) polymer layer. This polymer layer acts as an etch stop for the etch of the second dielectric layer, and is a method wherein two similar dielectric materials can be separated or distinguished from each other insofar as the etch is concerned by employing this buried polymer layer. A carbon polymer such as amorphous carbon, also acts as a good etch-stop. However, it tends to cause delamination of the second dielectric film due to poor adhesion to the polymer.

The process involved is deposition of polymer 22 on the oxide or dielectric 20 (to be protected) and uses $SiF_4$ or $SiF_4+O_2$ chemistry. This deposition process may etch some oxide initially but rapidly builds up a polymer rich in fluorine on the etched (or unetched dielectric) surface. A subsequent dielectric deposition (24) followed by the patterning/etch described does the rest.

A non-conducting silicon-rich oxyhalide or halide polymer film can be deposited in a controlled manner by using $SiF_4/O_2$ from irradiation or excitation by an RF field. The percent of $O_2$ controls the rate of deposition. These compounds can be straight chain or cyclic polymeric compounds. Typically, one would expect compounds containing alternate Si-Si and Si-O-Si links, e.g., $X_3Si-SiX_2-O-SiX_2-SiX_3$, where 'X' is the halide (fluorine in this case); see, for example, F. A. Cotton and G. Wilkinson, *Advanced Organic Chemistry*, John Wiley & Sons, page 356 (1964).

The polymer preferably comprises a silicon-oxyfluoride polymer, which is formed by the plasma deposition of $SiF_4$ and $O_2$. The volume percent of $O_2$ during deposition may range from about 5 to 90% (of $SiF_4$ volume). Less than about 5% does not form a good polymer, while greater than about 90% forms a layer that behaves more like $SiO_2$, and hence like the sandwiching layers, thereby defeating the purpose of forming the polymer. The best results are obtained in the range of about 10 to 20% oxygen.

It is possible to employ $SiF_4$ only, relying on residual air/moisture in the etch chamber after the pump-down to act as a source of oxygen for polymer formation. However, this embodiment is not as preferred as that involving the deliberate introduction of oxygen described above, which is a more predictable and controllable process.

The rate of formation and stoichiometry of the polymer are dependant on the oxygen to $SiF_4$ ratio, along with other plasma generation parameters such as power, pressure and total gas flow. Uniformity of the deposition is enhanced by using a non-reactive gas as a diluent (such as $N_2$, Ar, He, etc.). These films can be subsequently etched off (at slower rates) in conventional oxide etch chemistry or can be hydrolyzed and removed or alternately sputtered off easily.

A typical film was deposited under the following conditions: $O_2=5$ sccm, $SiF_4=35$ sccm, He$=80$ sccm, power$=700$ W, pressure$=40$ mTorr in a hexode-type batch processor.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. An etch stop layer for use in semiconductor processing consisting essentially of a silicon-oxyhalide polymer layer formed between two similar dielectric layers by the reaction of $SiX_4$ and oxygen, wherein X is halogen and the amount of oxygen ranges from about 5 to 90 volume percent, and wherein said silicon-oxyhalide polymer has a much lower etch rate than said dielectric layers.

2. The etch stop layer of claim 1 wherein said polymer consists essentially of a silicon-oxyfluoride polymer.

3. The etch stop layer of claim 1 wherein said polymer layer ranges from about 500 to 800 Å in thickness.

* * * * *